(12) United States Patent
Shimazaki et al.

(10) Patent No.: US 6,876,875 B2
(45) Date of Patent: Apr. 5, 2005

(54) MOBILE PHONE

(75) Inventors: Shu Shimazaki, 1-2-12, Nishisakado, Sakado-shi, Saitama-ken (JP); Ken Shimazaki, 4-14-19, Fujimi, Tsurugashima-shi, Saitama-ken (JP)

(73) Assignees: Shu Shimazaki, Saitama-Ken (JP); Ken Shimazaki, Saitama-Ken (JP); Beet Office Corporation, Saitama-Ken (JP)

( * ) Notice: Subject to any disclaimer, the term of this patent is extended or adjusted under 35 U.S.C. 154(b) by 493 days.

(21) Appl. No.: 10/039,014

(22) Filed: Jan. 2, 2002

(65) Prior Publication Data

US 2002/0123375 A1 Sep. 5, 2002

(30) Foreign Application Priority Data

Mar. 2, 2001 (JP) ........................................ 2001-107788

(51) Int. Cl.7 ................................................. H04B 1/38
(52) U.S. Cl. ................. 455/575.1; 455/575.4; 455/575.3; 455/569.1; 455/90.3; 379/428.01; 379/447; 379/455
(58) Field of Search ............................. 455/575.1, 90.3, 455/569.1; 379/455, 428.01, 447

(56) References Cited

U.S. PATENT DOCUMENTS

| | | | | |
|---|---|---|---|---|
| 5,822,427 A | * | 10/1998 | Braitberg et al. | 379/454 |
| 5,924,044 A | * | 7/1999 | Vannatta et al. | 455/556.1 |
| 6,044,153 A | * | 3/2000 | Kaschke | 379/433.01 |
| 6,078,825 A | * | 6/2000 | Hahn et al. | 455/569.2 |
| 6,127,801 A | * | 10/2000 | Manor | 320/112 |
| 6,219,419 B1 | * | 4/2001 | Chen | 379/452 |
| 6,415,161 B1 | * | 7/2002 | Fujita | 455/561 |
| 6,714,802 B1 | * | 3/2004 | Barvesten | 455/575.1 |

FOREIGN PATENT DOCUMENTS

JP        10-333766        12/1998

* cited by examiner

Primary Examiner—Marceau Milord
(74) Attorney, Agent, or Firm—Jordan and Hamburg LLP

(57) ABSTRACT

The purpose of the invention is to provide an improved mobile phone with prevention of numbed hands of the user under even a cold environment. The mobile phone includes a heating circuit. In the heating circuit, a battery 14 has connections with leading and trailing ends of a line 20 to be heated. The heated line 20 has connections with a thermostat 22 and an outside-operable switch 23. The heating circuit is disposed within the area where is between the bottom and the leading edge of the back casing 1b of the housing in the mobile phone.

7 Claims, 2 Drawing Sheets

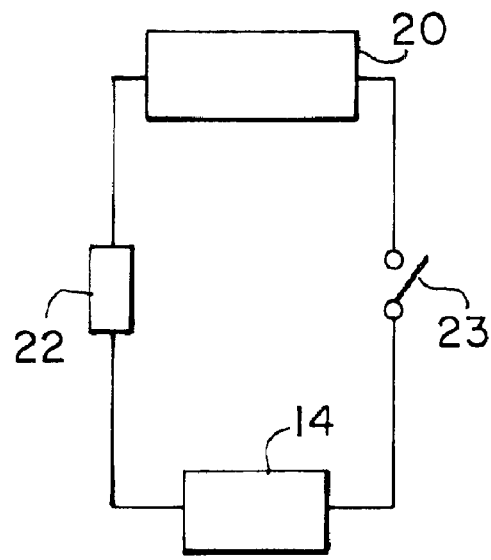
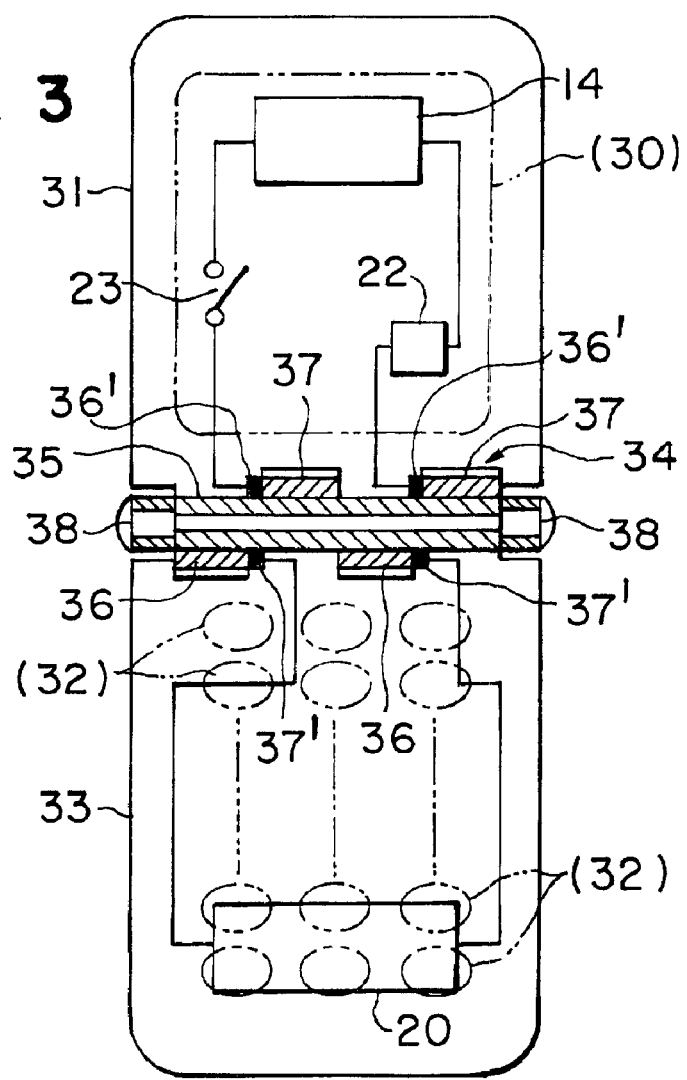

MOBILE PHONE

FIELD OF THE INVENTION

The present invention relates to a mobile phone having a measure to cold regions, and in detail relates to a mobile phone having a heat function of preventing a numbed hand of the user and deterioration in the electronic functions.

BACKGROUND OF THE INVENTION

The mobile phone can conveniently operate anywhere in the indoor such as an inner automobile or an underground passage, and the outdoor such as a baseball stadium or a field, within the reach of the electric wave. The display at the upper portion of the mobile phone gives the user various information. The user operates the mobile phone with push buttons at the lower body.

The mobile phone desires to provide possible communication between the calling and called parties under any environment. However, when the mobile phone is in the cold, the cold numbs the user's hand or causes bluredness of the display thereof and deterioration in the electronic circuit. Particularly, not only such the mobile phone but also other outdoor apparatuses often bother the user with the problems.

As an example of the prior arts, which disclose conventional apparatuses having improvement in solutions of the problems by a heat, JP 10-333766A teaches a handy information terminal apparatus that it is contained in a heat container having a complex heat comprised of a heater, and a heat pipe from the heater, about a battery and a display.

SUMMARY OF THE INVENTION

The present invention provides solution of the foregoing problems, wherein an improved mobile phone has a heat circuit which connects with its battery. The heat circuit includes a heating member, a thermostat, and a switch that it may operate outside. The heating member is at the position where is within the side height from the bottom of the inner back casing.

Preferably, the heating member of the heat circuit has a meandrous arrangement of a line on the bottom surface of the back casing.

The back casing comprises heat-conductive material such as aluminum alloy.

BRIEF DESCRIPTION OF THE INVENTION

FIG. 2 is a schematic circuit diagram of the heat circuit; and

FIG. 3 is a constructional view of the second type of mobile phone having the heat circuit

PREFERRED EMBODIMENT OF THE INVENTION

Figure 1:
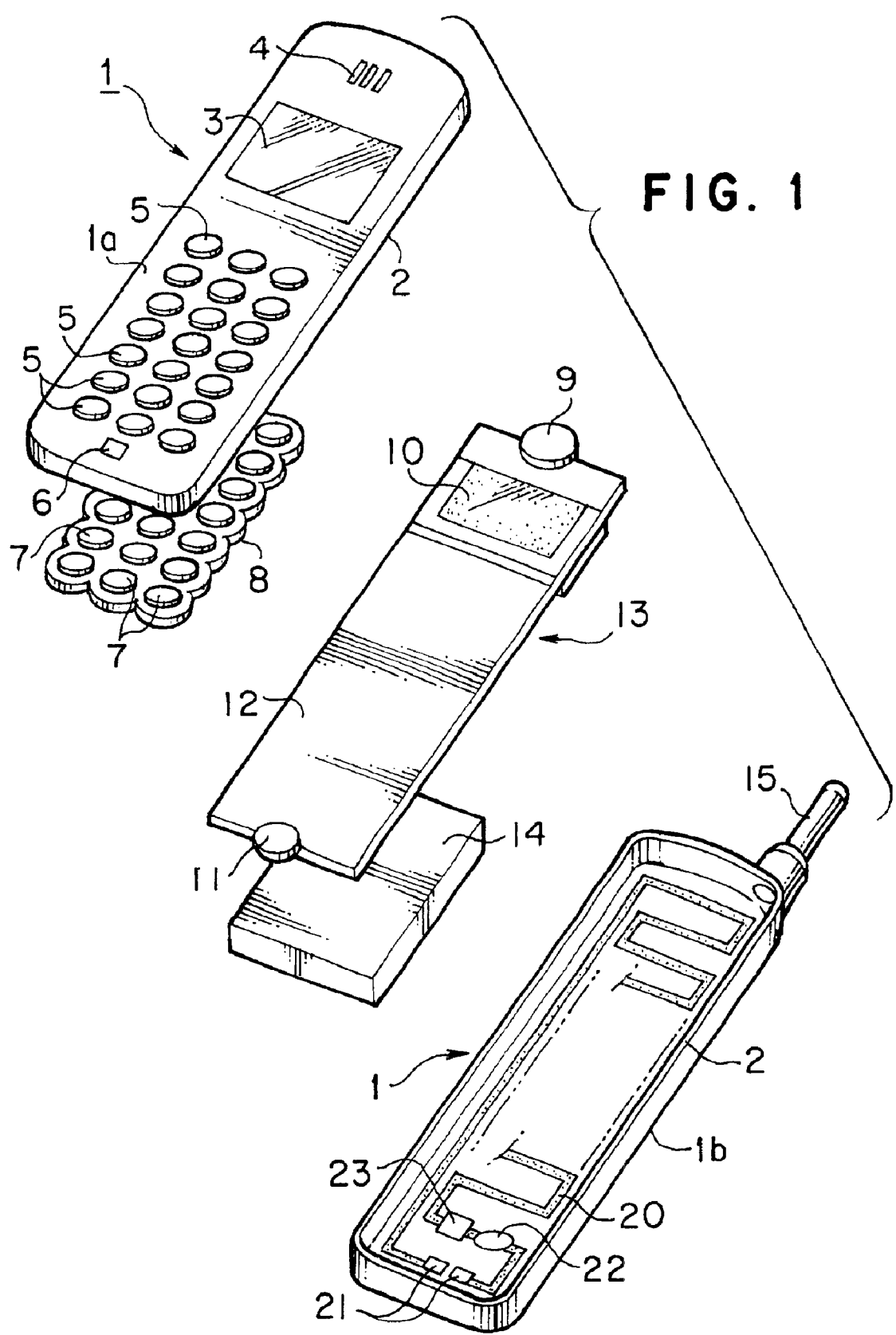
FIG. 1 is an disassembled oblique view of the first type of mobile phone having a heat circuit.

The style of generally known mobile phones are classified in general into two groups. FIGS. 1 and 3 are mobile phones having a single housing with a display and a plurality of number or symbol keys, and a folding body in which its display is disposed on the leading housing and its number or symbol keys are arranged on the trailing housing, respectively.

Referring to FIG. 1, a disassembled single housing type mobile phone is shown. The mobile phone has an oblong rectangular body 1 with a hollow shape. The body 1 comprises front and back casings 1a and 1b, which are each assembled thereinto. The side walls of the casings 1a and 1b have a partial engagement with respective corresponding ribs 2 to each other.

The front casing has a display screen 3, and an opening 4 for the phone's speaker, which are at its leading portion, and a plurality of number or symbol keys 5 and an opening 6 for the phone's microphone, which are at its trailing portion.

Location of the number or symbol keys 5 are on respective switch elements 7 of a switch board 8 disposed in the interior body 1 so that the pushed keys cause drive of respective switch elements 7. Such the mobile phone has a construction, which provides a speaker 9, a display 10, a microphone 11, and an electric circuit 12 for a single print circuit board 13 under the switch board 8. The speaker and microphone, and the display are disposed at respective leading and trailing portions of the print circuit 13 such that the formers are at the position of respective openings 4 and 6 on the front casing 1a at respective leading and trailing portions thereof, and the latter is at the position of the screen portion 3 on the front casing 1a at the leading portion thereof. Under the print circuit board 13 in the interior body 1, a battery 14 is disposed. From the top body 1, an antenna 15 is mounted.

The back casing 1b has a heater 20, which is a heating circuit disposed within the height of the internal side surfaces or the depth of the bottom. The heating circuit includes a line, two terminals 21 which connect to the battery 14 in the line at the leading and trailing ends thereof, and a thermostat 22 and a switch 23 which connect into the line, as shown in FIG. 2.

The liner member of the heating circuit has a meandrous arrangement as shown in FIG. 1. Preferably, it is formed in a flat and made of, for example, chromium material having heating properties. The formation of the line is a process such as printing.

In other ways than the foregoing, the heating circuit may be that a laminate material such as silicon rubber of synthetic resin or glass has a meandrous line pattern formed thereon. In addition, the pattern is not limited to a meandrous pattern.

Conventionally, the mobile phone body was made of synthetic plastics such as FRP (fluorocarbon resin polymers). However, in the instant application, only the back casing is made of aluminum alloy with high thermal conductivity.

Referring to FIG. 3, a folding type mobile phone, which is provided with the heating circuit, is shown. The phone has a foldable body, which comprises a distal casing 31 with a display screen 30, and a proximal casing 33 with a plurality of an arranged number or symbol keys 32. The distal casing 31 connects to the proximal casing 33 thorough the hinge mechanism. 34.

The hinge mechanism 34 comprises a C-shaped sectional connector portions 36 and 37 protruding from respective trailing and leading ends of the distal and proximal casings 31 and 33, each of the connector portions rotatably fitting on an outer circumferential surface of a hollow cylindrical member 35, both ends of the cylindrical member each having a terminal member provided thereto.

The heating circuit of such the mobile phone with the folding body also has a meandrous line 20, terminals 21, a thermostat 22, and a switch 23, and is inside of the folding body. In the folding body, the line passes between the distal and proximal back casings 31 and 33, and the meandrous arrangement is mainly at the trailing portion of the proximal back casing.

The establishment of the connected upper and lower lines of the heating circuit is provisions of conductive elements 36' and 37' at the hinge mechanism 34 that they are on, respectively, either one of the right and left sides of the C-shaped sectional connector parts 36 and 37 to connect to each other.

The conductive elements 36' and 37' at the hinge mechanism 34 have connections to the upper and lower lines of the heating circuit, respectively. The conductive elements 36' and 37' connect to the leading and trailing ends of respective lines on the side of distal and proximal back casings.

Connection between the upper and lower lines is not limited to the foregoing. It may make change in the design dependent on shaped mobile phones with separate casings.

Description will now be made in further detail of the heating circuit that it acts in both of the mobile phones as shown in FIGS. 1 and 3.

The heating circuit operates, when one of the keys 5 or at least one special key actuates the switch to on. Current flows from the battery 14 to heat the heating circuit. The aluminum back casing 1b of the body 1 or the aluminum distal and proximal back casings 31 and 33 heats up with the thermal energy generated from the heating circuit.

Generally, the display screen of the mobile phone, which displays information with liquid crystal, is liable to disorder at the high temperature in excess of 40° C. In the instant application, when the heated back casing exceeds a temperature of 40° C., the thermostat 22 provides automatic interruption of the current flowing into the heating circuit. This permits keeping of non-exceeding 40° C. temperature inside of the mobile phone's body.

Referring to FIG. 1, the meandrous arrangement of the heating circuit is within the whole area of the back casing bottom of the single body type mobile phone. Such the heating circuit allows for averaged heating of the back casing 1b.

Whereas, the heating circuit in FIG. 3 is of a partial arrangement that it is only on the side of the proximal back casing 33. This is because the display screen of the folding type mobile phone is disposed within the interior area smaller than that of FIG. 1. Additionally, in the folding type mobile phone, both the battery 14 and switch of the heating circuit are about its display 30 inside of the upper casing. Since the meandrous arranged heating circuit within the small area causes generation of higher thermal energy, the display will experience collective heat.

Furthermore, as shown in FIGS. 1 and 3, the body with only the aluminum back casing also eliminates the collective heat to the display. The back casing(s), which are made of aluminum alloy and get heat, have no cold temperature under even a cold environment. This eliminates a blured display under even a cold environment and deterioration in the electronic functions. In addition, it eliminates a numbed hand of the user under even a cold environment.

As be clarified above, the assemblage of the heater into the mobile phone only requires a circuit board or substrate on which a meandrous line or a partial meandrous line to be heated is arranged, and provision of such the circuit board or substrate at the time when the body does not have the assembled display and keys. Therefore, the heater according to the instant invention does not make the mobile phone complicated constructions.

As be additionally described above, the heating circuit may be surface heat generator (silicon rubber heater) in place of the meandrous line that is formed on the print circuit board.

What is claimed is:

1. A mobile phone comprising a housing comprised of a pair of front and back casings, the front casing having a display device and a plurality of keys;
   power source means disposed in said housing; and
   a heating circuit, which comprises a line to be heated through connection with said power source means, the heating circuit having a thermostat and a out-operable switch which are connected therein, the heated line being arranged between the distal and proximal portions of the back casing,
   wherein said housing has separation of distal and proximal housing parts extending from respectively, a point substantially intermediate thereof to respective distal and proximal ends of the mobile phone, a point between the trailing end of said distal housing part and the leading end of said proximal housing part has connecting means for connecting said distal housing part pivotable thereabout to said proximal housing part pivotable thereabout so that said housing has fold thereabout, a part of said heating circuit has a meandrous arrangement which is at the back casing of said proximal housing, and each of said thermostat and out-operable switch of said heating circuit is at the back casing of said distal housing part.

2. The mobile phone in claim 1, wherein the back casing comprises aluminum alloy.

3. The mobile phone in claim 1, wherein said connecting means is hinge means that it connects said distal and proximal housing parts pivotable thereabout, and is provided at the opposite ends of respective distal and proximal housing parts to each other, the heated line on the side of said distal housing part having connection with the heating line on the side of said proximal housing through at least one conductive element at said hinge means.

4. A mobile phone comprising a housing comprised of a pair of front and back casings, the front casing having a display device and a plurality of keys;
   power source means disposed in said housing; and
   a heating circuit, which comprises a line to be heated through connection with said power source means, the heating circuit having a thermostat and an out-operable switch which are connected therein, the heating circuit being arranged between the distal and proximal portions of the back casing,
   wherein said housing has separation of distal and proximal housing parts extending from respectively, a point substantially intermediate thereof to respective distal and proximal ends of the mobile phone so that it can fold, and
   wherein the distal and proximal housing parts couple with each other through hinge means at the point substantially intermediate of the mobile phone that it is unfolded, the hinge means being opposedly provided on each of the distal and proximal housing at respective trailing and leading ends thereof, said heated line on the side of said distal housing part having connection with said heated line on the side of said proximal housing part through at least one conductive element provided at the position of the said hinge means.

5. The mobile phone in claim 4, wherein a part of the heated line in said heating circuit has a meandrous arrangement.

6. The mobile phone in claim 5, wherein the back casing comprises aluminum alloy.

7. The mobile phone in claim 5, wherein the heated line of said heating circuit has a partial meandrous arrangement, and wherein the back casing comprises aluminum alloy.

* * * * *